(12) United States Patent
Vinet et al.

(10) Patent No.: US 8,969,148 B2
(45) Date of Patent: Mar. 3, 2015

(54) METHOD FOR PRODUCING A TRANSISTOR STRUCTURE WITH SUPERIMPOSED NANOWIRES AND WITH A SURROUNDING GATE

(71) Applicant: Commissariat a l'energie atomique et aux ene alt, Paris (FR)

(72) Inventors: Maud Vinet, Rives (FR); Sylvain Barraud, Le Grand Lemps (FR); Laurent Grenouillet, Rives (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/862,830

(22) Filed: Apr. 15, 2013

(65) Prior Publication Data
US 2013/0302955 A1 Nov. 14, 2013

(30) Foreign Application Priority Data

Apr. 16, 2012 (FR) ...................... 12 53490

(51) Int. Cl.
| | |
|---|---|
| *H01L 29/66* | (2006.01) |
| *B82Y 10/00* | (2011.01) |
| *B82Y 40/00* | (2011.01) |
| *H01L 29/417* | (2006.01) |
| *H01L 29/775* | (2006.01) |
| *H01L 29/06* | (2006.01) |

(Continued)

(52) U.S. Cl.
CPC ........... *H01L 29/66477* (2013.01); *B82Y 10/00* (2013.01); *B82Y 40/00* (2013.01); *H01L 29/41775* (2013.01); *H01L 29/66439* (2013.01); *H01L 29/775* (2013.01); *H01L 29/0673* (2013.01); *H01L 29/1033* (2013.01); *H01L 29/413* (2013.01); *Y10S 977/888* (2013.01); *Y10S 977/938* (2013.01)
USPC ............ 438/197; 977/888; 977/938; 977/888

(58) Field of Classification Search
None
See application file for complete search history.

(56) References Cited

U.S. PATENT DOCUMENTS

| | | |
|---|---|---|
| 2004/0063286 A1 | 4/2004 | Kim et al. |
| 2006/0071275 A1* | 4/2006 | Brask et al. ................... 257/350 |

(Continued)

FOREIGN PATENT DOCUMENTS

| | | |
|---|---|---|
| EP | 2 178 111 A1 | 4/2010 |
| WO | WO 2008/069765 A1 | 6/2008 |
| WO | WO 2010/090978 A1 | 8/2010 |

OTHER PUBLICATIONS

French Preliminary Search Report issued Feb. 11, 2013, in French Application No. 12 53490 filed Apr. 16, 2012 (with English Translation of Categories of Cited Documents).

(Continued)

*Primary Examiner* — Charles Garber
*Assistant Examiner* — Alia Sabur
(74) *Attorney, Agent, or Firm* — Oblon, McClelland, Maier & Neustadt, L.L.P.

(57) ABSTRACT

The present invention relates to a method for producing a microelectronic device having a channel structure formed from superimposed nanowires, in which a nanowire stack having a constant transverse section is firstly formed, followed by a sacrificial gate and insulating spacers, where source and drain areas are then formed by growth of semiconductor material on areas of the stack which are not protected by the sacrificial gate and the insulating spacers (FIG. 4D).

10 Claims, 19 Drawing Sheets

(51) Int. Cl.
*H01L 29/10* (2006.01)
*H01L 29/41* (2006.01)

(56) References Cited

U.S. PATENT DOCUMENTS

| | | |
|---|---|---|
| 2006/0216897 A1 | 9/2006 | Lee et al. |
| 2008/0135949 A1* | 6/2008 | Lo et al. .................. 257/401 |
| 2010/0022801 A1 | 1/2010 | Shinya |
| 2010/0099233 A1 | 4/2010 | Wacquez et al. |
| 2010/0295021 A1 | 11/2010 | Chang et al. |
| 2011/0281412 A1 | 11/2011 | Ernst et al. |
| 2012/0007051 A1* | 1/2012 | Bangsaruntip et al. ......... 257/24 |
| 2012/0138886 A1* | 6/2012 | Kuhn et al. ....................... 257/9 |

OTHER PUBLICATIONS

L. K. Bera et al., "Three Dimensionally Stacked SiGe Nanowire Array and Gate-All-Around p-MOSFETs", Electron Devices Meeting, 2006, 4 pages.

Mansun Chan et al., "3-D Matrix Nano-Wire Transistor Fabrication on Silicon Substrate", Solid-State and Integrated Circuit Technology (ICSICT), 10$^{th}$ IEEE International Conference, 2010, 4 pages.

* cited by examiner

METHOD FOR PRODUCING A TRANSISTOR STRUCTURE WITH SUPERIMPOSED NANOWIRES AND WITH A SURROUNDING GATE

TECHNICAL FIELD

The present invention relates to the field of microelectronics, and more specifically that of transistors, and relates to the production of at least one transistor having a channel semiconductor structure in the form of multiple nanowires, and a surrounding gate around the nanowires, and which is also compact.

PRIOR ART

Production of a transistor the channel structure of which is formed from multiple nanowires is known.

Document WO 2010/090978 discloses, for example, a method for producing such a type of transistor having a channel structure with juxtaposed nanowires connecting source and drain areas.

Production of a transistor having a channel structure with superimposed nanowires connecting source and drain areas is also known.

Figure 1A:
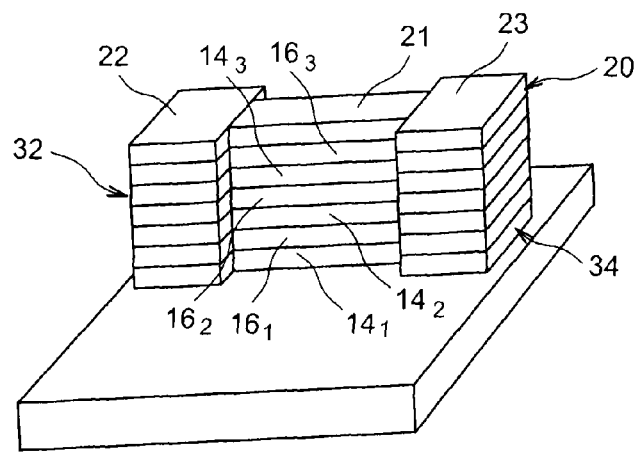

A method for manufacturing such a transistor may include the formation of a stack of semiconductor layers including alternating layers of Si and of SiGe, which are etched through a hard mask 20. This hard mask 20 may be formed from a pattern 21 of elongated shape connecting together two other wider patterns 22, 23. Etching is then accomplished through hard mask 20 to form superimposed nanowires $14_1, 16_1, 14_2, 16_2, 14_3, 16_3$ under pattern 21 of elongated shape and blocks 32, 34 which are wider than the nanowires under other patterns 22, 23. Wider blocks 32, 34 are intended to form source and drain areas, connected together by a channel form from a stack of superimposed nanowires $14_1, 16_1, 14_2, 16_2, 14_3, 16_3$ (FIG. 1A).

Figure 1B:
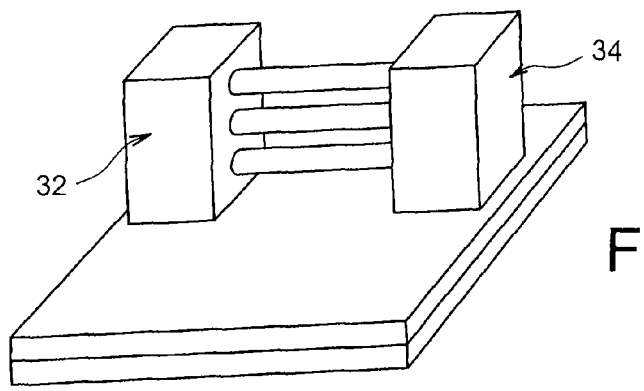

A selective removal of the SiGe relative to the Si is then accomplished, so as to release Si nanowires $14_1, 14_2, 14_3$, (FIG. 1B).

Document WO 2008/069765 A1 presents, for example, such a type of method.

Figure 1C:
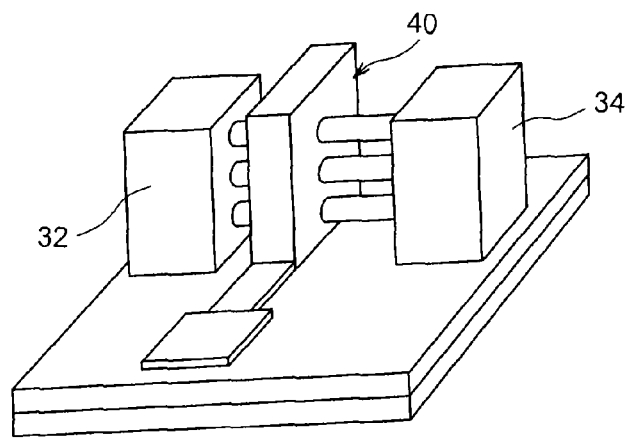

A gate 40 is then produced on the Si nanowires between source block 32 and drain block 34, by deposition of gate material followed by etching (FIG. 1C).

With such a method, in order to allow the Si nanowires to be released whilst enabling the structure to be maintained, restrictive design rules must be applied to define the patterns of hard mask 20, and consequently elements 32, 34, $14_1, 16_1, 14_2, 16_2, 14_3, 16_3$. As a consequence of these design rules source and drain blocks 32, 34 are bulky.

With such a method, both satisfactory positioning and also satisfactory definition of the gate pattern prove to be difficult to obtain.

To resolve the problem of positioning of the gate, and to limit the effects of a possible positioning asymmetry of the source and drain blocks relative to the gate, there may be a tendency to wish to increase the length of the nanowires, and to make the distance between the source and drain blocks still greater.

When the nanowires are released by etching, a substantial separation of the nanowires can however lead to a phenomenon of buckling of the nanowires, of loss of strain when these nanowires are made of a strained semiconductor material, and of loss of uniformity of the transverse section of the nanowires positioned under the surrounding gate.

Document US 2011/0281412A1 presents another method for producing a transistor with a channel structure in the form of nanowires, and having a surrounding gate around the nanowires, where this gate is formed by a method of the damascene type.

Figure 2A:
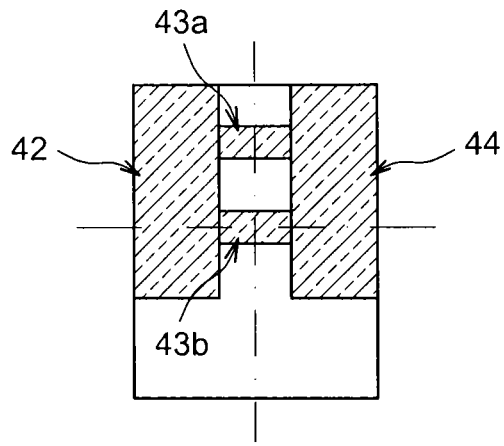

In such a method, in a stack of semiconductor layers including alternating layers of Si and of SiGe, a structure including stacks 43a, 43b of nanowires connecting a source semiconductor block 42 and a drain semiconductor block 44 (FIG. 2A) is produced.

Figure 2B:
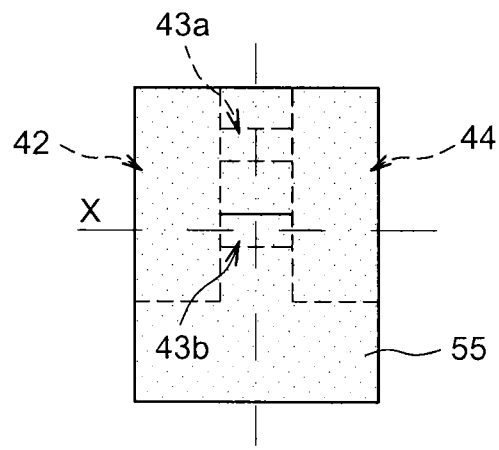

The structure of an insulating layer 55 is then covered (FIG. 2B).

Figure 2C:
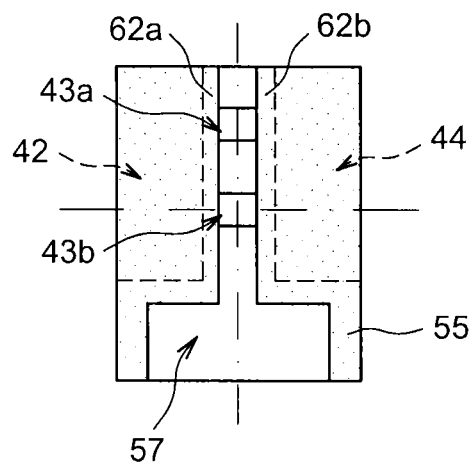

After this an opening 57 shaped with a gate pattern is then formed in this insulating layer 55. Opening 57 is produced so as to keep insulating spacers 62a, 62b against source block 42 and drain block 44 (FIG. 2C).

Figure 3A:
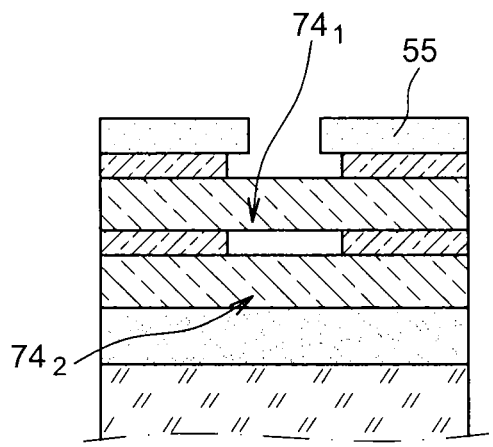

Insulating layer 55, for its part, is removed from the nanowire stacks to enable selective removal of the SiGe compared to the Si, and by this means to release Si nanowires $74_1, 74_2$, (FIG. 3A illustrates a transverse section of the structure).

Figure 2D:
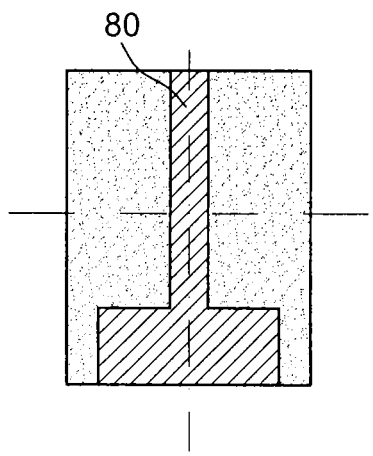
Figure 3B:
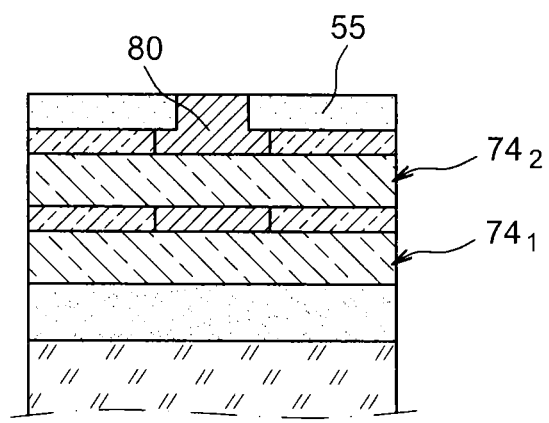

After this, gate 80 is formed by filling opening 57 with a gate stack (FIG. 2D, and FIG. 3B illustrating the structure with a transverse section).

With such a method insulating spacers are formed between the gate and the source and drain blocks, whilst allowing the gate pattern to be defined more easily, and also allowing improved positioning of the gate compared to the previously described method example.

However, as with the previously described method example, to enable the Si nanowires to be released whilst allowing the structure to be held in place restrictive design rules are required, which implies that the source and drain blocks must be of a minimum size.

Furthermore, with such a method the length of gate 80 is not uniform.

With such a method, gate length is defined by the initial distance between source and drain blocks 42, 44, this distance itself being dependent on the design rules relating to the size of the source and drain blocks, and the width of the nanowires, which prevents short gates, and in particular gates less than 25 nm in length, from being produced.

Document US° 2006/0216897° A1 presents a method for producing a transistor having a semiconductor channel structure with nanowires, formed by a first etching of a stack of layers made of different semiconductor materials, followed by a selective etching in order to produce a channel structure in the form of multiple nanowires.

With such a method after the first etching and before the selective etching, a step of additional etching of the stack is required to reduce the critical dimension of the nanowires. In addition such a method is restrictive in terms of design rules.

The problem of finding an improved method of producing a transistor having a semiconductor channel structure in the form of multiple nanowires, and having a surrounding gate around the nanowires, which is compact, but which also has a limited number of steps, and which allows less restrictive design rules to be followed, is posed.

DESCRIPTION OF THE INVENTION

The present invention relates firstly to a method for producing a microelectronic device including a transistor having a semiconductor structure formed of nanowires, wherein the method includes the following steps:

a) production on a support, a stack or multiple juxtaposed stacks of superimposed nanowires, where the stack or stacks has/have a constant transverse section, and is/are formed from alternating nanowires of at least one first semiconductor material, and of at least one second semiconductor material, b) formation of a sacrificial gate on, and against the side walls of, at least one central area of at least one or more of said nanowire stacks, c) formation of insulating areas against side walls of said sacrificial gate, so as to cover areas of said side walls of said stacks, either side of said central area of said stacks, d) formation of semiconductor areas on end areas of at least one of said stacks by growth of at least one semiconductor material.

In step a) the stacks are produced with a constant transverse section, such that the end areas of the stacks have a section equal to that of the central area of these stacks.

After step a) the nanowires have a critical dimension dc, which may then be maintained throughout the method without requiring a step of reduction of this critical dimension.

The method according to the invention thus allows use of design rules which are less strict than the methods for producing nanowires according to the prior art.

The method according to the invention is particularly advantageous in the case that in step a) several stacks of juxtaposed nanowires are formed, since, when it is planned to use several juxtaposed stacks of constant transverse section, it enables an increased nanowire integration density to be obtained.

In step d), after a sacrificial gate and insulating spacers have been produced in the central areas of the stacks, the end area dimensions of the stacks which are revealed, and in particular are not covered either by the insulating areas or by the sacrificial gate, are increased to produce transistor source and drain blocks.

By this means the final bulk of the source and drain blocks is limited.

With such a method the design rule constraints relative to the area occupied by the source and drain blocks on the support, and to the separation of the source and drain blocks, are also limited, compared in particular to methods in which the source and drain blocks are produced by etching at the same time as the semiconductor structure connecting them.

By forming the source and drain areas after the nanowire stack the design rule constraints relative to the separation of the transistors are also limited. Transistors may thus be produced which are closer to one another, and the integration density of the transistors on a substrate may be increased.

In step a) the formation of the nanowire stacks may include the etching, through a hard mask, of a stack of alternating layers of the first semiconductor material, and of the second semiconductor material.

According to one possible implementation the nanowire stack or stacks may be covered with the hard mask in step d).

This hard mask may thus enable the nanowire stack to be formed by etching in step a), and prevent growth of semiconductor material on the top of this stack in step d).

According to one possible implementation the hard mask may have a constant transverse section.

The method may also include, after step d), the following steps:
  formation on said support of a masking layer covering said stack or stacks and the sacrificial gate,
  formation of an opening in the masking layer including the etching of the sacrificial gate so as to reveal said central area of said nanowire stack or stacks.

By this means access is provided to the central area of the nanowire stack or stacks, whilst protecting the remainder of this or these stack(s).

The opening may have a critical dimension equal, or roughly equal, to the length of the sacrificial gate. The term "roughly equal" here means differing by less than 5 nanometers.

The dimensions of the opening are thus chosen according to those of the sacrificial gate. Subsequent filling of the opening by the sacrificial gate may then enable a gate of dimensions which are equal, or roughly equal, to that of the sacrificial gate to be produced.

The sacrificial gate may be formed in step b) by etching of a gate stack through another hard mask, where the formation of said opening in the masking layer includes the selective etching of said other hard mask before the sacrificial gate is etched.

The other hard mask may thus be made of a material which can be etched selectively relative to the material of the masking layer.

This other hard mask may have a critical dimension equal, or roughly equal, to the length of the sacrificial gate.

The method may also include, after formation of the masking layer, and before the formation of said opening, a step of removal of the masking layer until said other hard mask is reached.

The opening may thus be formed by first accomplishing a selective etching of the other hard mask, without being obliged to perform a step of photolithography.

The method may also include the selective removal in said opening of the second semiconductor material relative to the first semiconductor material.

By this means portions of the nanowires made of the first semiconductor material located in the opening are released, and these portions can then be covered by a gate, without the remainder of the stack being affected.

After this selective removal of the second semiconductor material relative to the first semiconductor material a gate may be formed in said opening.

By this means a gate may be obtained the dimensions and positioning of which depend on the dimensions and positioning of the opening, where the dimensions and positioning of the opening, for their part, depend on the dimensions and positioning of the other hard mask having enabled the sacrificial gate to be produced.

The gate may advantageously be formed in said opening on and around nanowires of the same critical dimension dc as at the conclusion of step a) of formation of the stack or stacks of constant transverse section.

In this case, after step a) the nanowires have a critical dimension dc which is maintained throughout the method without a step of additional etching of the nanowires being accomplished.

Every reduction of dimension in the course of the manufacturing method may lead to the formation of additional stray capacitances.

This also enables a substantial integration density to be implemented.

The nanowires may thus be designed with a small critical dimension in step a) without an additional step of reduction of their critical dimension being required.

According to one possible implementation of the method in which step b) includes the formation of a sacrificial gate on one or more stacks from among said stacks, and the formation of another sacrificial gate on one or more other stacks from among said other stacks, and in which another opening is made in said masking layer covering said stacks, the method may also include the removal of said other sacrificial gate through said other opening, followed by the selective removal of the first semiconductor material relative to the second semiconductor material in said other opening.

A transistor having a channel structure formed from multiple nanowires made of the first semiconductor material and from a surrounding gate, and a transistor having multiple nanowires made of the second semiconductor and of a surrounding gate, may thus be produced on the same support.

According to one possible implementation, in step d) or between step c) and step d), semiconductor areas with a serrated profile may be formed.

A serrated profile for the source and drain areas may enable improved contact areas, for example contact areas made of an alloy of semiconductor material and metal, to be produced on the source and drain areas.

The present invention also relates to a microelectronic device including:
- a transistor channel structure formed of superimposed nanowires made of a first semiconductor material, where the channel structure connects a first semiconductor block including a source area of said transistor, and a second semiconductor block including a drain area of said transistor,
- where the first semiconductor block and the second semiconductor block are formed on a stack support including portions of said nanowires made of the first semiconductor material alternating with portions of nanowires made of a second semiconductor material,
    - where a gate encases a central portion of said nanowires made of the first semiconductor material of said channel structure,
    - first insulating spacers positioned on the support against side walls of said gate and covering side areas of the first semiconductor block,
    - second insulating spacers positioned on the support against side walls of said gate and covering side areas of the second semiconductor block,
    - where the gate has a constant critical dimension in a plane of section transverse to the elongation direction of the nanowires.

BRIEF DESCRIPTION OF THE ILLUSTRATIONS

Figure 8B:
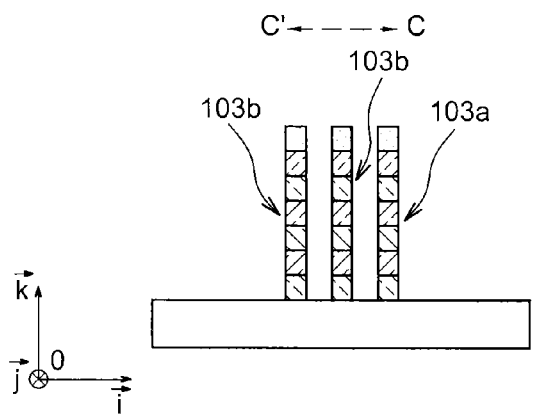
Figure 6C:
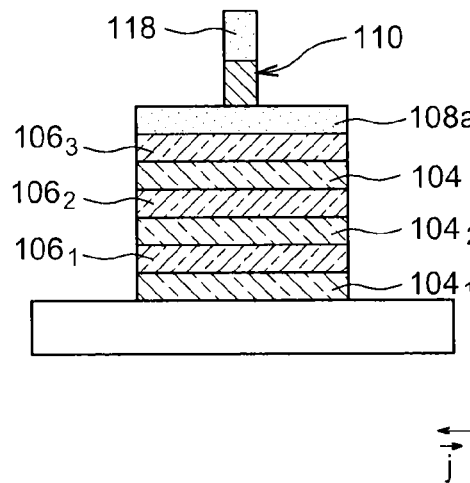
Figure 7C:
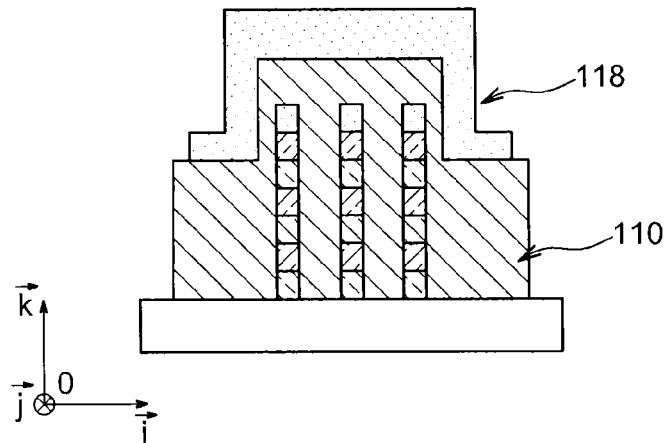
Figure 8C:
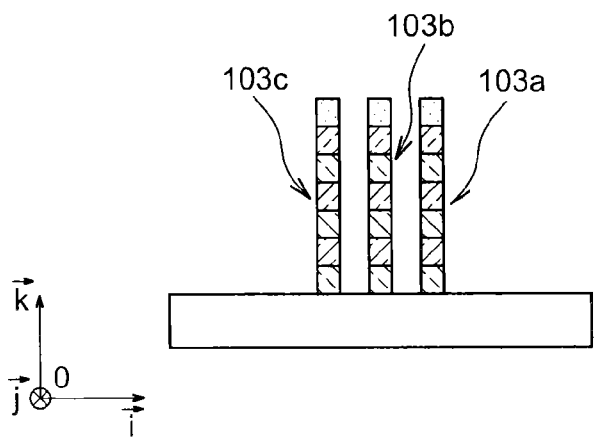
Figure 6D:
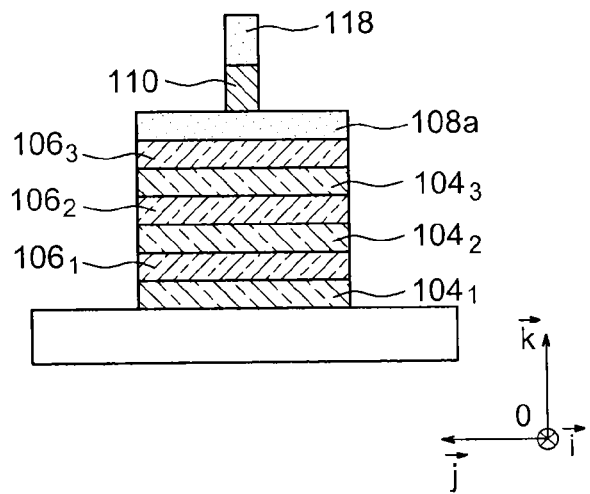
Figure 7D:
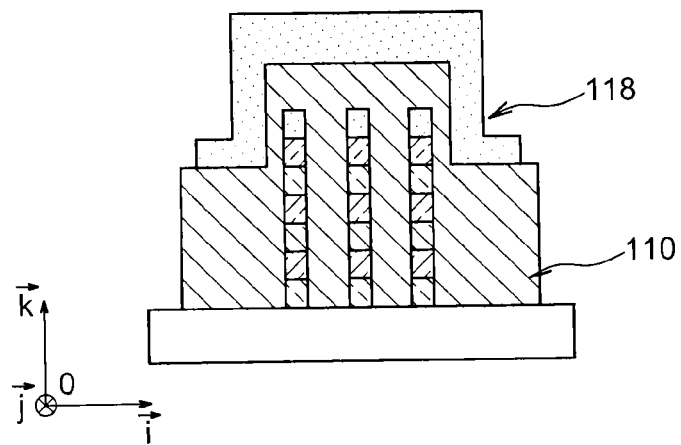
Figure 8D:
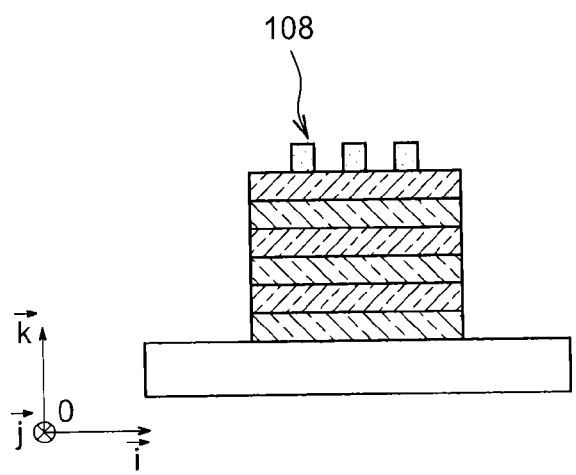
Figure 6E:
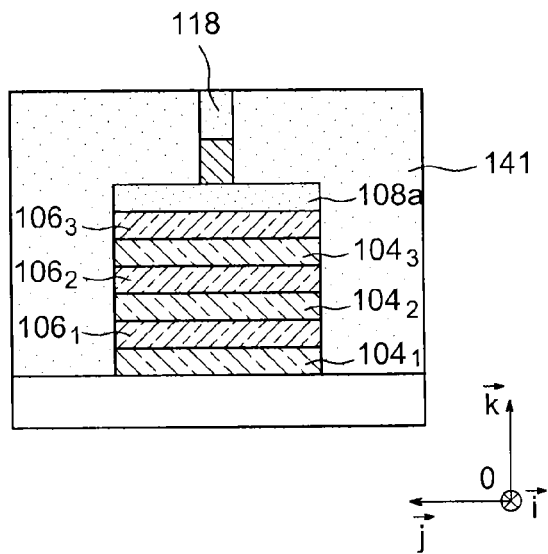
Figure 7E:
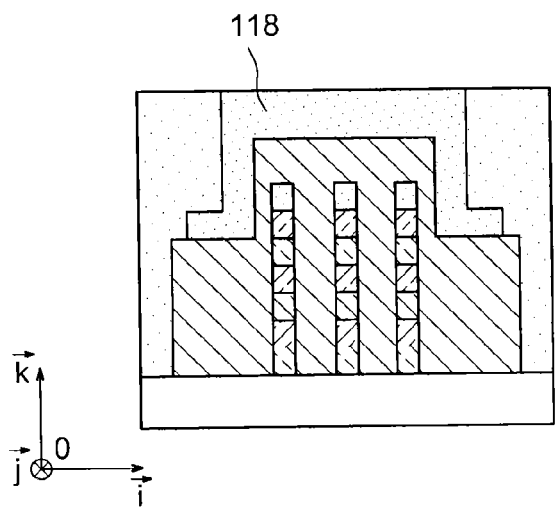
Figure 8E:
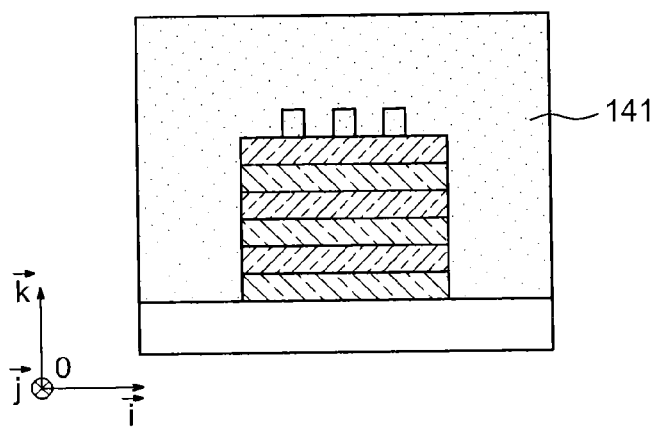
Figure 6F:
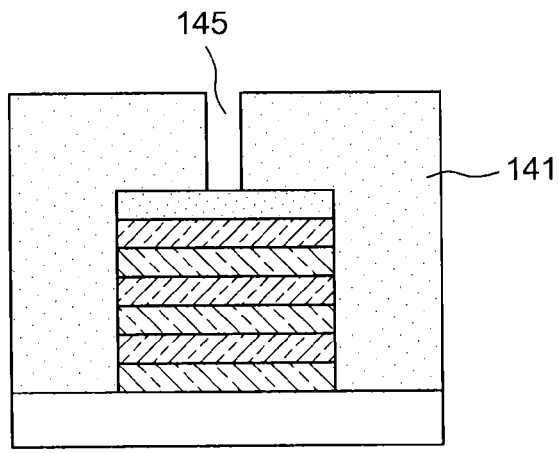
Figure 7F:
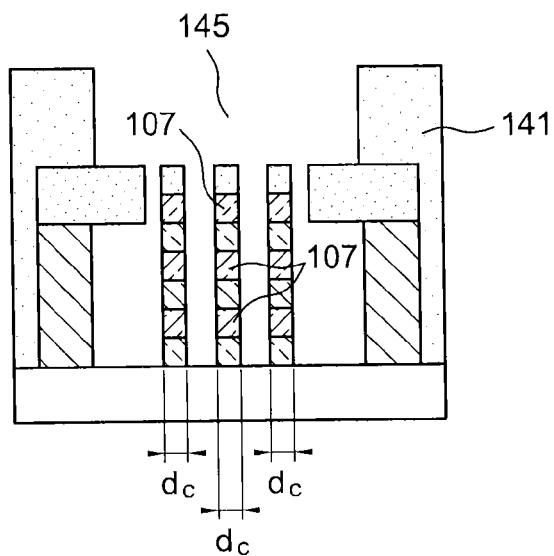
Figure 8F:
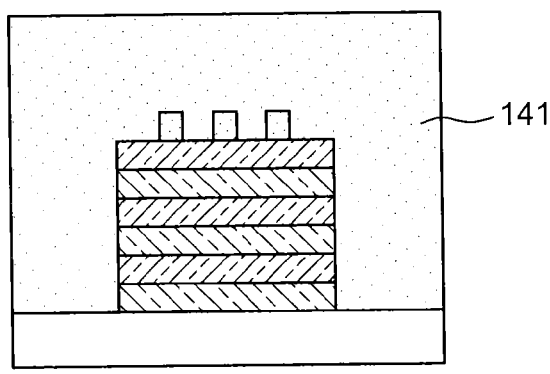
Figure 7H:
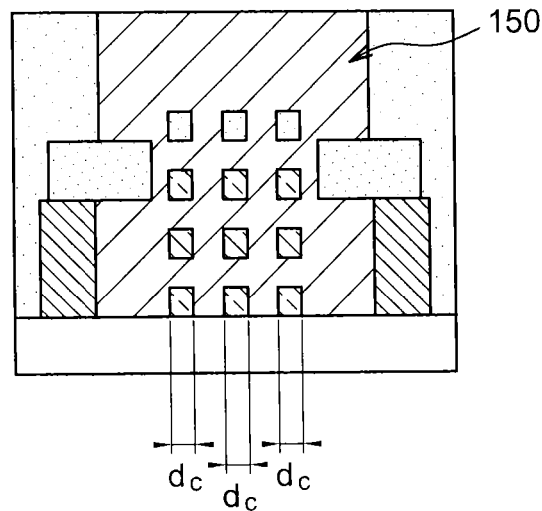
Figure 8H:
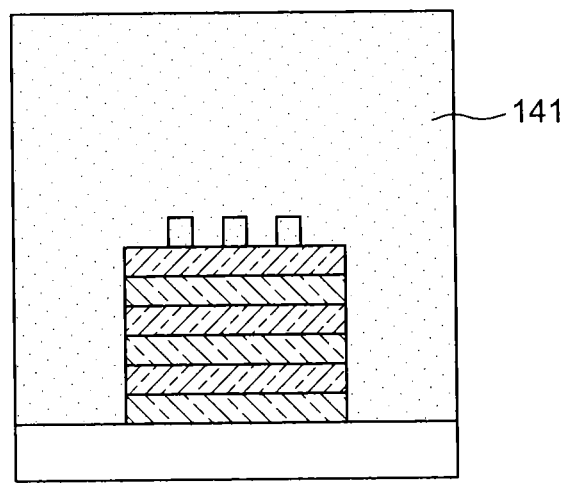
Figure 9A:
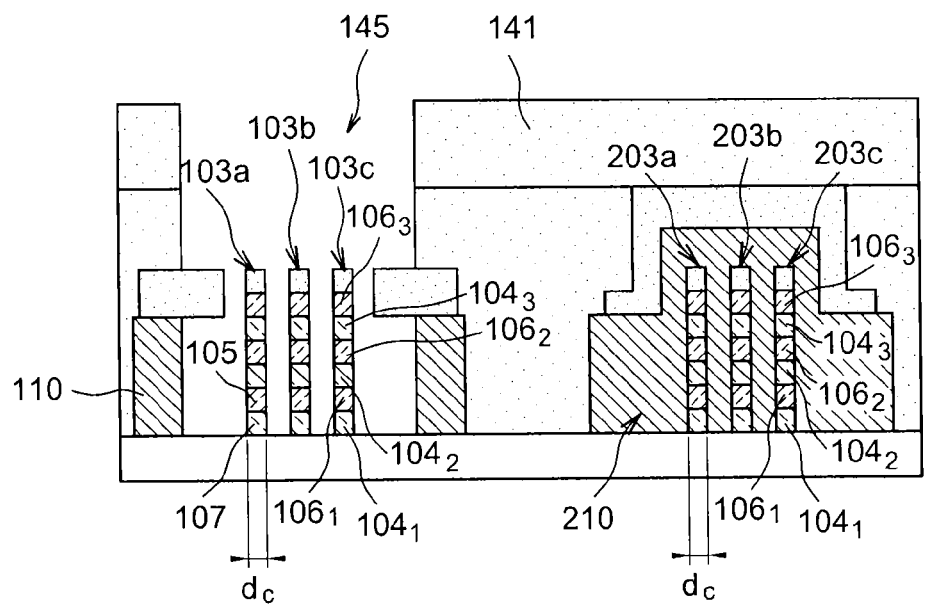
Figure 9B:
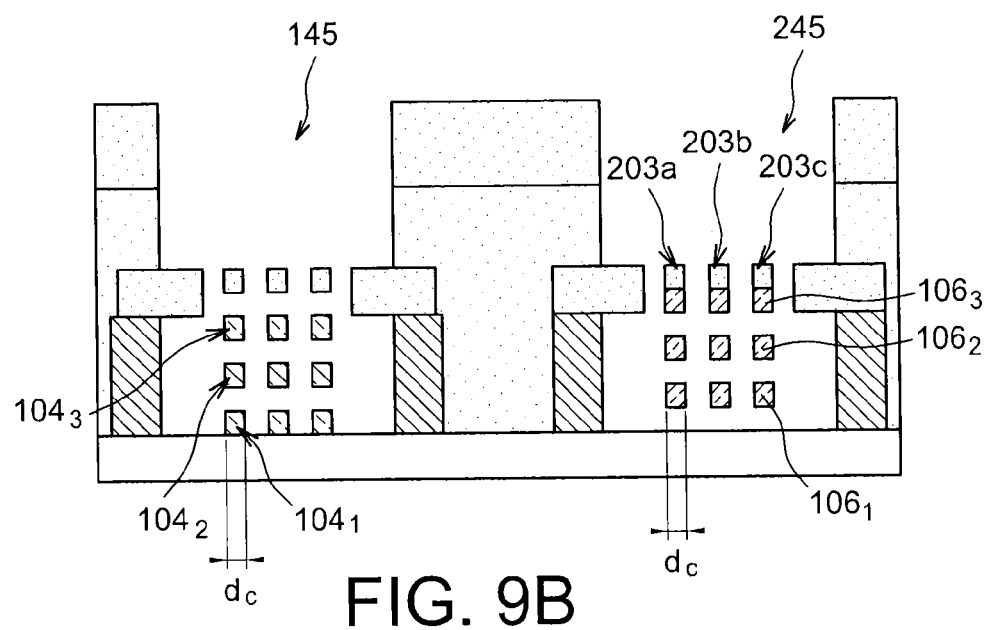

The present invention will be better understood on reading the description of examples of embodiment given, purely as an indication and in no sense restrictively, making reference to the appended illustrations in which:

FIGS. 1A to 1C illustrate an example method, according to the prior art, for producing a transistor channel structure with superimposed nanowires and with a surrounding gate, FIGS. 2A to 2D, and 3A to 3B, illustrate another example method, according to the prior art, for producing a transistor channel structure with superimposed nanowires and with a surrounding gate, where insulating spacers are installed against the gate, FIGS. 4A to 4F, 5A to 5H, 6A to 6H, 7A to 7H, and 8B to 8H, illustrate an example of a microelectronic method, according to the invention, including the production of a transistor structure with superimposed nanowires and with a surrounding gate of uniform dimension, FIGS. 9A and 9B illustrate an example of a microelectronic method, according to the invention, enabling, on a single support, an NMOS transistor structure with superimposed nanowires and with a surrounding gate and a PMOS transistor structure with superimposed nanowires and with a surrounding gate to be produced.

The various parts represented in the figures are not necessarily represented at a uniform scale, in order to make the figures more readable.

DETAILED DESCRIPTION OF PARTICULAR EMBODIMENTS

An example of a method for producing a microelectronic device including a transistor having a semiconductor structure formed from multiple nanowires will now be described in connection with FIGS. 4A-4F (representing a portion of the semiconductor structure in the course of production, as a perspective view), FIGS. 5A-5H (representing the semiconductor structure in the course of production, as a top view) FIGS. 6A-6H (representing the semiconductor structure in the course of production, as a transverse section view B'B indicated in FIGS. 5A-5H), FIGS. 7A-7H (representing the semiconductor structure, as a transverse section view A'A indicated in FIGS. 5A-5H), FIGS. 8B-8H (representing the semiconductor structure, as a section view C'C indicated in FIGS. 5B-5H).

The initial material of the method may be a support 100, such as a substrate of a type commonly called "bulk", formed from a conductive support layer, or such as a substrate of the semiconductor-on-insulator type, for example of the SOI (Silicon On Insulator) type, or of the sSOI (Strained SOI) type, formed from a semiconductor layer, for example made of Si, covered with an insulating layer, for example made of $SiO_2$, which is itself covered with a fine semiconductor layer.

Figure 4A:
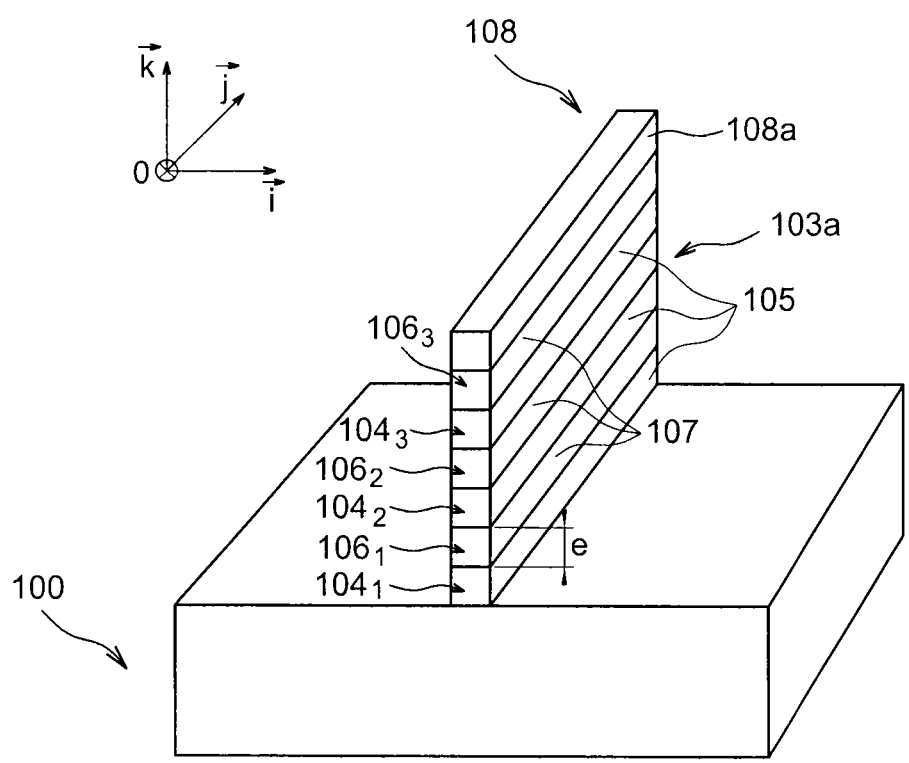

On this support 100 several stacks 103a, 103b, 103c of semiconductor bars, also called nanowires, are firstly formed (a single stack 103a is illustrated in FIG. 4A, and in the following FIGS. 4B-4F). These stacks 103a, 103b, 103c may each be formed from alternating bars or nanowires $104_1$, $104_2$, $104_3$ of a first semiconductor material 105 such as, for example, silicon, and bars or nanowires $106_1$, $106_2$, $106_3$ of a second semiconductor material 107 such as, for example, $Si_xGe_y$. Second semiconductor material 107 may have a germanium content of between, for example, 10 and 100%, and preferably between 15% and 50%, in order to allow satisfactory etching selectivity between first semiconductor material 105 and second semiconductor material 107.

According to one possible implementation, first semiconductor material 105 may be strained, for example tension-strained silicon, while second semiconductor material 107 may be strained, for example compressive-strained $Si_xGe_y$.

To produce the nanowires stacks, a stack of semiconductor layers is firstly produced, formed for example by epitaxy, consisting of alternating layers of first semiconductor material 105 and of second semiconductor material 107.

The stack of layers is then a etched through a mask, which may be a hard mask 108 made, for example, of silicon nitride such as $Si_3N_4$.

In this example (FIGS. 5A and 7A), hard mask 108 is formed from several blocks 108a, 108b, 108c of constant transverse section (where the transverse section is defined as a section made in a plane parallel to plane $[\circ; \vec{i}; \vec{k}]$ of orthogonal marker $[\circ; \vec{i}; \vec{j}; \vec{k}]$ in FIGS. 4A to 7A).

Through blocks 108a, 108b, 108c, which may be of parallelepipedic shape, an etching, which may be anisotropic, is made of the stack of semiconductor layers, such that the nanowires of stacks 103a, 103b, 103c reproduce the shape of blocks 108a, 108b, 108c, and also have a constant transverse section.

Each stack 103a, 103b, 103c therefore has ends with a transverse section which is roughly equal, or equal, to that of its centre.

Nanowires $104_1$, $106_1$, $104_2$, $106_2$, $104_3$, $106_3$ obtained after this etching may thus be of parallelepipedic shape. Nanowires $104_1$, $106_1$, $104_2$, $106_2$, $104_3$, $106_3$ may also have a critical dimension dc of between, for example, 5 nanometers and 25 nanometers.

Figure 7A:
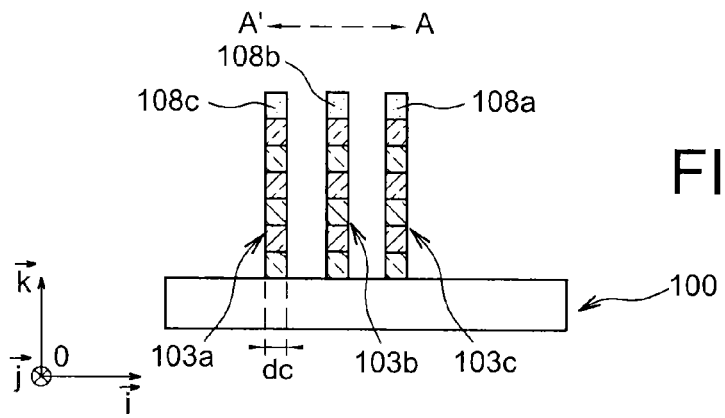
Figure 5G:
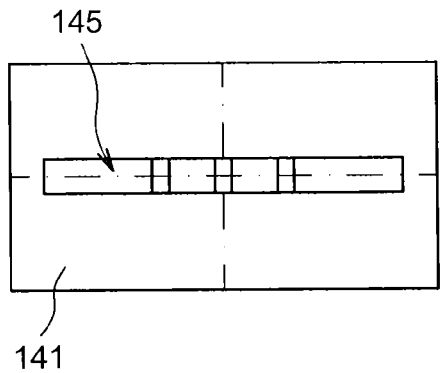
Figure 7G:
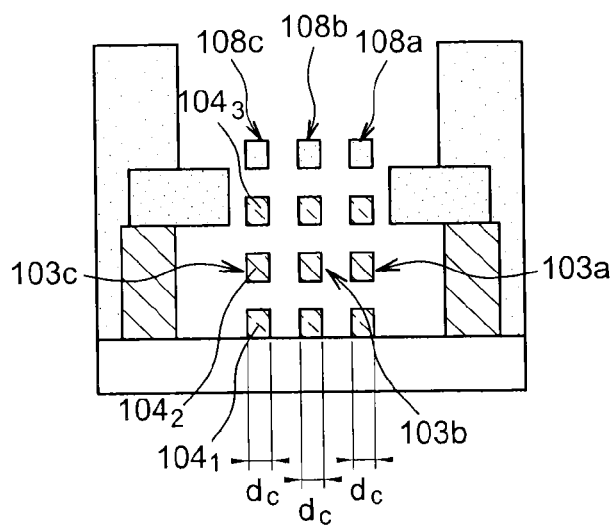
Figure 8G:
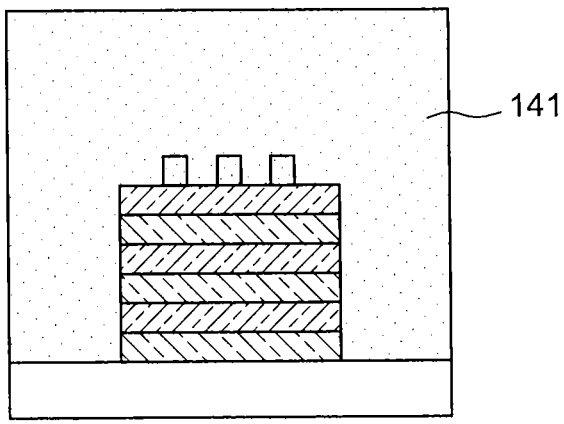
Figure 5H:
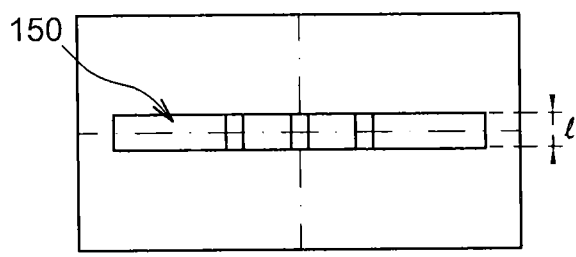

The term "critical dimension" is understood to mean, throughout the entire description, the smallest dimension of a pattern except for its thickness, where the critical dimension is measured in a direction parallel to the main plane of the support (where the main plane of the support is defined in FIGS. 4A and 7A as a plane parallel to plane $[\circ; \vec{i}; \vec{j}]$ of an orthogonal marker $[\circ; \vec{i}; \vec{j}; \vec{k}]$).

Nanowires $104_1$, $106_1$, $104_2$, $106_2$, $104_3$, $106_3$ may have a thickness e, of between, for example, 2 nanometers and 50 nanometers (measured in a direction parallel to vector $\vec{k}$ of orthogonal marker $[\circ; \vec{i}; \vec{j}; \vec{k}]$ in FIG. 4A).

Nanowires $104_1$, $106_1$, $104_2$, $106_2$, $104_3$, $106_3$ may also have a length of between, for example, 20 nanometers and 150 nanometers (measured in a direction parallel to vector $\vec{j}$ of orthogonal marker $[\bigcirc; \vec{i}; \vec{j}; \vec{k}]$ in FIG. 4A), in particular for a designed gate length of between 10 and 100 nm. The total length of the nanowires is preferably greater than a minimum length equal to the total gate length, and twice the length of the contacts.

After this (FIGS. 4B, 5B, 6B, 7B, 8B), in a central region of the nanowire stacks, a gate dielectric is formed, for example a gate oxide such as TEOS, covered with at least one layer of gate material, for example such as polysilicon.

The gate stack produced in this manner in a central region of nanowire stacks 103a, 103b, 103c covers the top and side walls of this central region of stacks 103a, 103b, 103c.

Figure 4B:
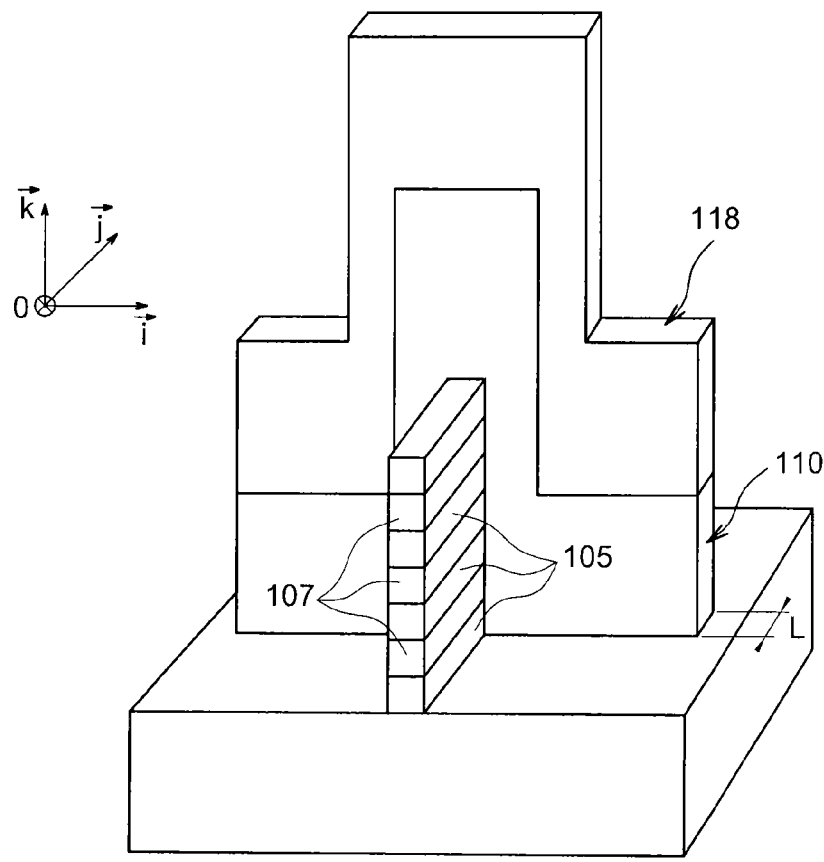
Figure 5B:
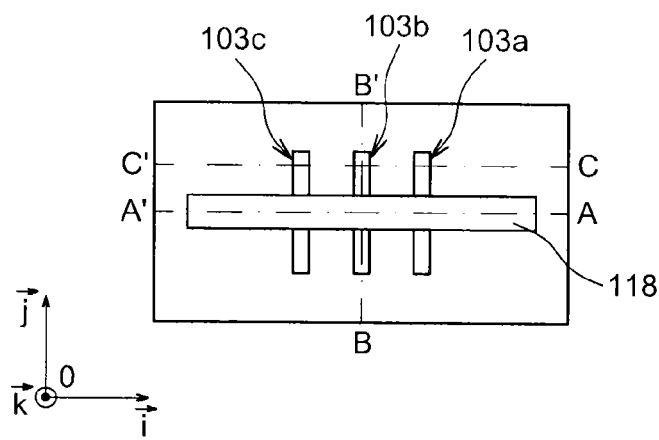
Figure 6G:
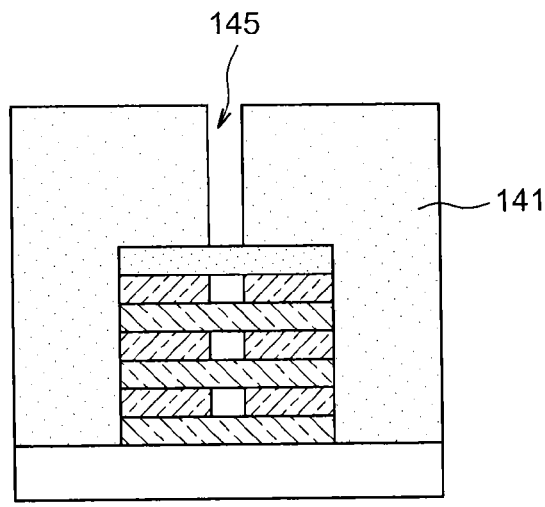
Figure 6H:
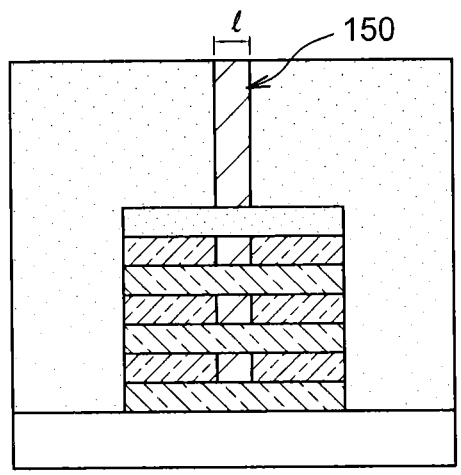
Figure 6B:
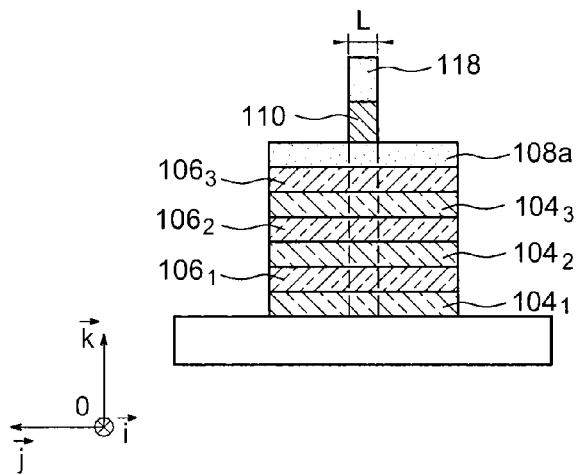
Figure 7B:
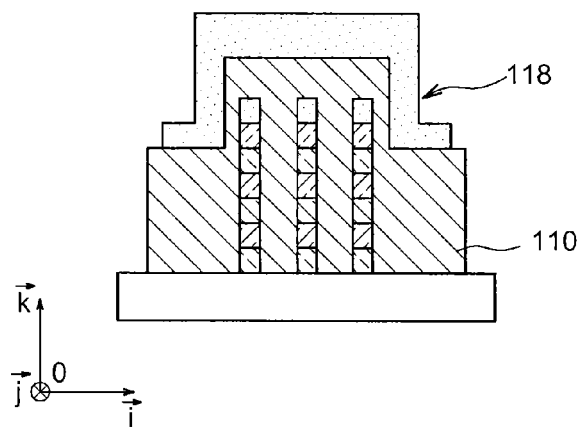

The height of the gate stack may thus be (measured in a direction orthogonal to support 100, and parallel to vector $\vec{k}$ of orthogonal marker $[\circ; \vec{i}; \vec{j}; \vec{k}]$ in FIGS. 4B, 6B, 8B) greater than that of nanowire stacks 103a, 103b, 103c.

This gate stack is then etched through a mask, which may be a hard mask 118 having an artificial gate shape, so as to form a sacrificial gate 110 covering the top and side walls of a central area of stacks 103a, 103b, 103c.

Hard mask 118 may be, for example, between 10 nm and 100 nm thick, and may be, for example, made of silicon nitride such as $Si_3N_4$.

Sacrificial gate 110 may be formed with a length L (measured in a direction parallel to vector $\vec{j}$ of orthogonal marker $[\circ; \vec{i}; \vec{j}; \vec{k}]$ in FIGS. 4B and 6B) of, for example, between 10 nm and 150 nm. Length L of sacrificial gate 110 may be equal to the critical dimension of hard mask 118.

After this (FIGS. 4C, 5C, 6C, 7C, 8C), insulating areas 120a, 120b, also called spacers, are formed against sacrificial gate 110 and hard mask 118, either side of each of stacks 103a, 103b, 103c of semiconductor bars.

Figure 4C:
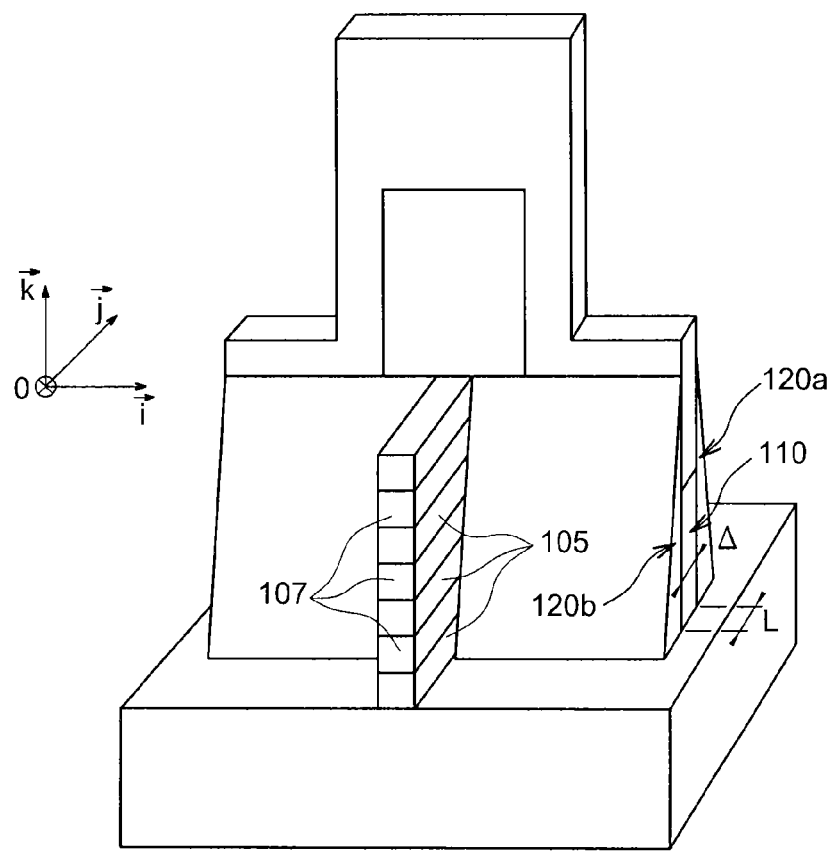
Figure 5C:
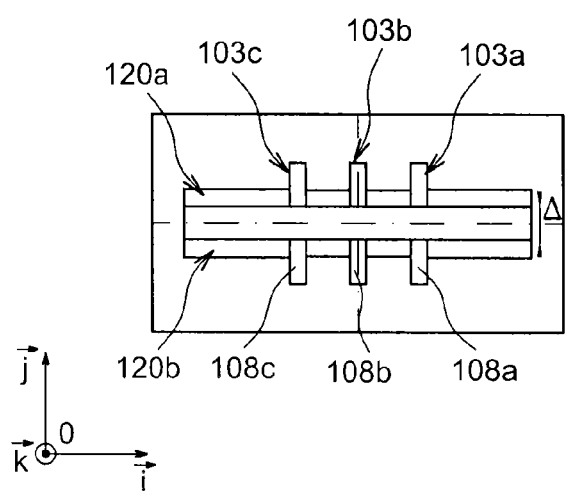

Insulating areas 120a, 120b are spaced between one another with a distance Δ equal to length L of sacrificial gate 110 (where L and Δ are measured in a direction parallel to vector $\vec{j}$ of orthogonal marker $[\circ; \vec{i}; \vec{j}; \vec{k}]$ in FIGS. 4C and 5C).

Insulating areas 120a, 120b and sacrificial gate 110 are thus produced such that they cover and mask a central area of each stack 103a, 103b, 103c of semiconductor nanowires, where these nanowires have free ends, which are not covered with another material. The ends of the nanowires are not, in particular, covered either by insulating areas 120a, 120b, or by hard masks 108, 118, or sacrificial gate 110.

Insulating areas 120a, 120b may be produced by deposition of an insulating layer, for example made of silicon nitride or of a stack of layers formed from a layer of silicon oxide on support 100, as far as the level of hard mask 108, followed by etching of this insulating layer.

After this, source 137 and drain 139 areas are formed at the ends of stacks 103a, 103b, 103c.

This may be accomplished by growth of semiconductor material in the free areas of the nanowires, i.e. in the areas of stacks 103a, 103b, 103c which are revealed and are not covered by hard mask 108 or by insulating areas 120a, 120b, or by sacrificial gate 110 surmounted by hard mask 118 (FIGS. 4D, 5D, 6D, 7D, 8D).

According to one possible implementation, a growth of first semiconductor material 105 at the ends of nanowires $104_1$, $104_2$, $104_3$ made of first semiconductor material 105, and/or a growth of second semiconductor material 107 at the ends of nanowires $106_1$, $106_2$, $106_3$ made of second semiconductor material 107, may thus be accomplished.

After this step, nanowires $104_1$, $104_2$, $104_3$, $106_1$, $106_2$, $106_3$ of stacks 103a, 103b, 103c have free ends which are wider than in their central portion covered by sacrificial gate 110 and by insulating areas 120a, 120b. After this step, the nanowires retain their critical dimension dc.

Figure 4D:
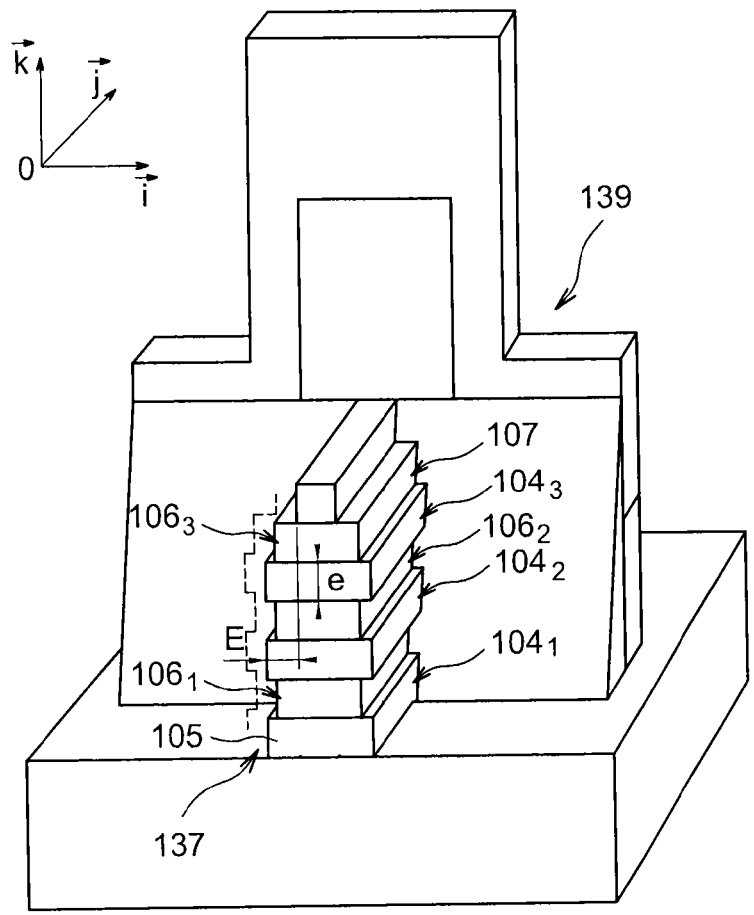
Figure 5D:
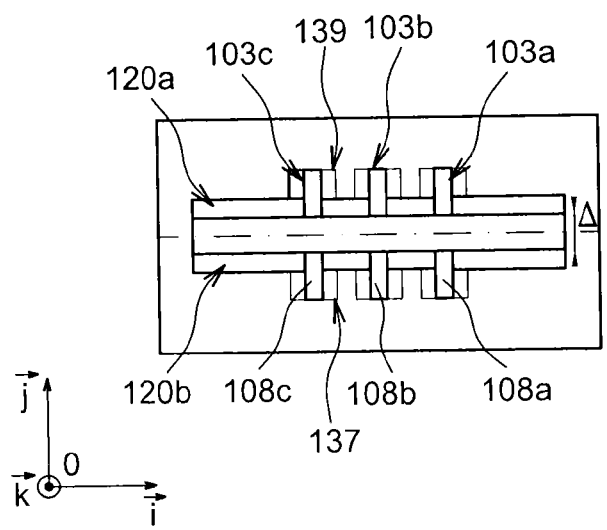
Figure 4E:
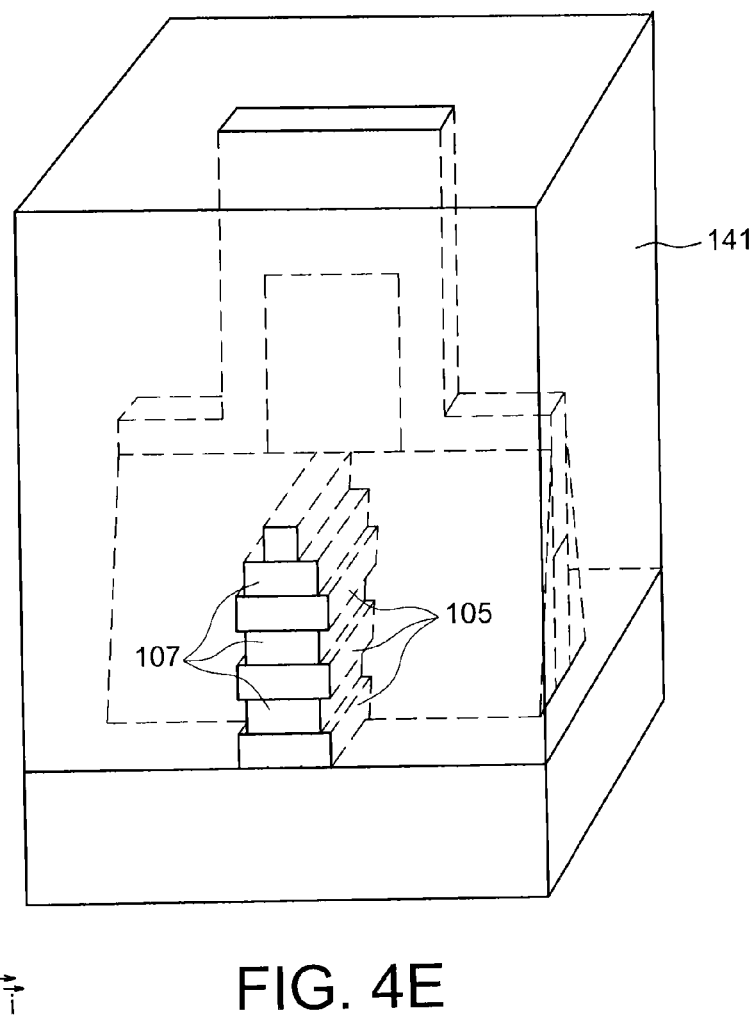
Figure 5E:
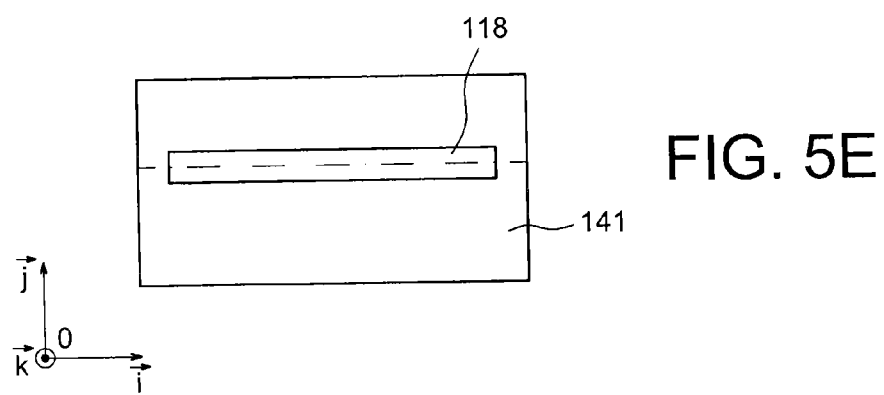
Figure 4F:
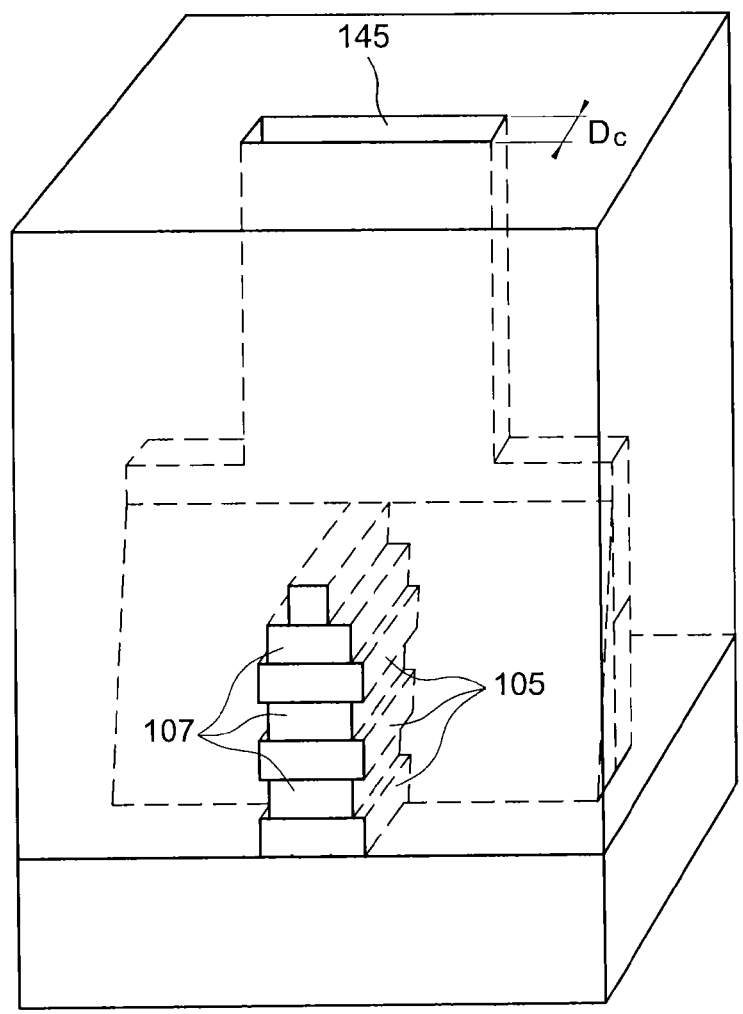
Figure 5F:
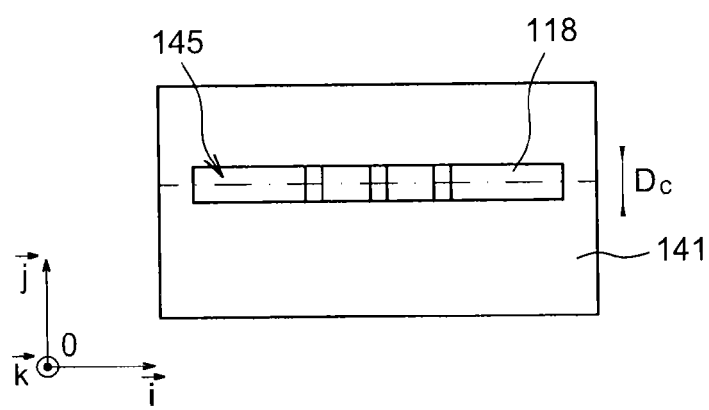
Figure 5A:
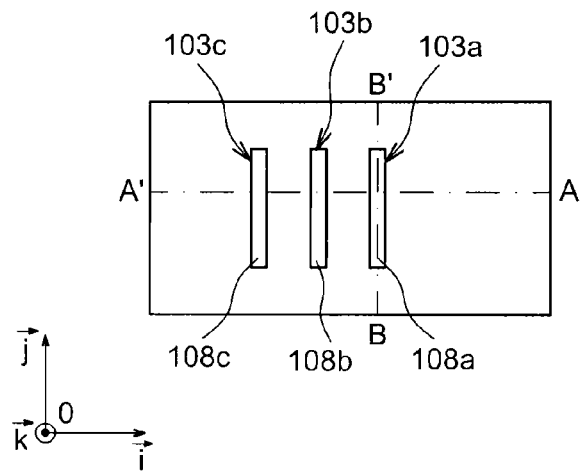
Figure 6A:
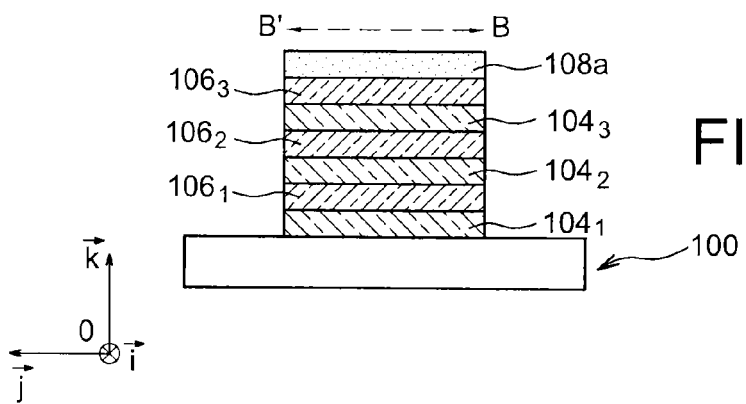

The growth may be accomplished such that thickness E (measured in a direction parallel to support 100 and to plane $[\circ; \vec{i}; \vec{j}]$ of orthogonal marker $[\circ; \vec{i}; \vec{j}; \vec{k}]$ in FIG. 4D) of conductive material formed by growth on the nanowires may be, for example, between 10 nm and 50 nm.

By growth of semiconductor material in the nanowires' free ends, the source and drain areas' dimensions are adjusted.

A serrated profile may be formed on the source and drain areas.

This serrated profile may be obtained by using, during the growth, a gas capable of selectively etching the second semiconductor material relative to the first semiconductor material.

This gas may be, for example, HCl, particularly if the second semiconductor material is SiGe.

To obtain different serrated profiles the HCl content may be modified.

With a precursor made of silane for growth of Si, or a precursor made of dichloro-silane and germanium for growth of SiGe.

Source 137 and drain 139 areas may also be doped. This doping may be accomplished after growth, for example by boron-based ion implantation if it is desired to produce a transistor of the PMOS type, or phosphorus- or arsenic-based ion implantation if it is desired to produce a transistor of the NMOS type.

According to another possibility, the doping may be accomplished in situ during the growth by epitaxy of the source and drain areas, by incorporating boron or phosphorus, for example.

After this a masking layer 141 is formed on the support so as to cover the structure and second hard mask 118.

Masking layer 141 may be chosen such that it is made of a material which can be etched selectively relative to the material of second hard mask 118. This masking layer 141 may be made from a silicon oxide such as those commonly called PMD (Pre-Metal Dielectric) oxides, which are generally used before steps of production of metal elements.

A step of removal, for example by CMP (Chemical Mechanical Planarisation) planarizing or polishing of this masking layer 141 is then accomplished, stopping at the top of second hard mask 118. By this means the upper face or top of hard mask 118 is revealed after this step of removal (FIGS. 4E, 5E, 6E, 7E, 8E). This may subsequently enable this hard mask 118 to be removed, without being obliged to perform a step of photolithography requiring an alignment.

After this, an opening 145 is made in masking layer 141, the base of which reveals the support, so as to reveal once again the central portion of stacks 103a, 103b, 103c. This opening 145 is made firstly by removing second hard mask 118 covering stacks 103a, 103b, 103c.

Second hard mask 118 may be etched selectively relative to the material of masking layer 141 using, for example, chemical etching using TMAH (TetraMethylAmmonium Hydroxide).

Produced opening 145 may have a constant section. Opening 145 made in the masking layer enables the precise impression of sacrificial gate 110 to be retained.

Opening 145 formed in masking layer 141 may have a position and dimensions designed according to those of insulating areas 120a, 120b. Opening 145 may thus have a critical dimension Dc equal, or roughly equal, to length L of sacrificial gate 110 (where critical dimension Dc is measured in a direction parallel to vector $\vec{j}$ of orthogonal marker [$O$; $\vec{i}$; $\vec{j}$; $\vec{k}$] in FIGS. 1F and 2F).

Opening 145 is then elongated, also removing portions of sacrificial gate 110 located above nanowire stacks 103a, 103b, 103c and against the side walls of the nanowires in the central region of stacks 103a, 103b, 103c.

Sacrificial gate 110 may be removed, for example, by wet etching using a solution of TMAH (TetraMethylAmmonium Hydroxide), stopping at the sacrificial gate dielectric (FIGS. 4F, 5F, 6F, 7F 8F), which is then removed in opening 145.

After this, (FIGS. 5G, 6G, 7G, 8G) one of semiconductor materials 105, 107 is then selectively removed relative to the other semiconductor material.

For example, a removal of second semiconductor material 107 selectively relative to first semiconductor material 105 may be accomplished, in particular if it is desired to produce a transistor of the NMOS type. This selective removal may be accomplished, for example by vapour-phase chemical etching, for example using Hcl with a carrier gas, or by chemical etching using $CF_4$, if the removed material is $Si_xGe_y$.

Suspended nanowires made of first semiconductor material 105 are obtained by this means in opening 145. Nanowires $104_1$, $104_2$, $104_3$ made of first semiconductor material 105 may thus have an outlined central portion, in other words one which is not covered with another material. Second semiconductor material 107 is retained at the end of nanowires $104_1$, $104_2$, $104_3$, $106_1$, $106_2$, $106_3$, outside opening 145. After this etching, nanowires $104_1$, $104_2$, $104_3$ made of first semiconductor material 102 retain a critical dimension dc.

Through this opening 145 a gate may then be formed.

A gate stack may be produced in a conformal manner, for example using deposition by CVD (Chemical Vapour Deposition), a gate dielectric, for example made of $HfO_2$, or HfSiON, and at least one gate material, for example formed from a layer of metal such as TiN or TaN and a layer of semiconductor material such as polysilicon, so as to fill opening 145.

By this means a surrounding gate 150 is formed around a central portion of nanowires $104_1$, $104_2$, $104_3$ of critical dimension dc (FIGS. 5H, 6H, 7H, 8H).

Gate 150 is thus formed around a central portion of nanowires $104_1$, $104_2$, $104_3$, critical dimension dc of which is the same as after the production of the stacks described above in connection with FIGS. 4A, 5A, 6A, 7A.

A step of removal of the gate material extending above opening 145 may then be accomplished.

After this step a gate having a gate length l (measured in a direction parallel to vector $\vec{j}$ of orthogonal marker [$o$; $\vec{i}$; $\vec{j}$; $\vec{k}$] in FIGS. 5H and 8H) defined by critical dimension Dc of opening 145 is produced. Gate 150 may have a constant length l roughly equal to distance Δ separating insulating areas 120a, 120b from one another, and to length L of sacrificial gate 110 which has been previously removed may be obtained by this manner.

Thus, in the method which has just been described, after the nanowire stacks have been produced (FIGS. 4A, 5A, 6A, 7A), a step of reduction of the dimensions of these nanowires is not required with the method according to the invention.

It may be planned, in order to limit the bulk of the transistor structure when producing nanowire stacks of small critical dimension dc and which it is not necessary to etch once again subsequently in order to reduce this critical dimension dc.

Since the ends of the stacks are protected during the step of selective removal of second semiconductor material 107 described in connection with FIGS. 4F-4G, 5F-5G, 6F-6G, 7F-7G, the fact that nanowire stacks of critical dimension dc have been designed poses no problem of stability of the structure.

A variant of the example production method described above, enabling nanowire transistors of the PMOS type and nanowire transistors of the NMOS type to be formed on the same support 100, will now be given in connection with FIGS. 9A-9B.

In this example, a first set of several stacks 103a, 103b, 103c of semiconductor nanowires and a second set of several stacks 203a, 203b, 203c, of semiconductor nanowires are formed on a support 100. Each of stacks 103a, 103b, 103c, 203a, 203b, 203c has a constant transverse section with nanowires of critical dimension dc.

Each of stacks 103a, 103b, 103c, 203a, 203b, 203c is formed from alternating nanowires $104_1$, $104_2$, $104_3$ of a first semiconductor material 105 such as, for example, Si, and nanowires $106_1$, $106_2$, $106_3$ of a second semiconductor material 107 such as, for example, $Si_xGe_y$, by etching of semiconductor layers through hard masks (not represented).

After steps of formation of sacrificial gates 110, 210 in each set of nanowire stacks 103a, 103b, 103c, and 203a, 203b, 203c, and of insulating spacing areas (not represented) either side of sacrificial gates 110, 210 have been accomplished, masking layer 141 covering stacks 103a, 103b, 103c, and 203a, 203b, 203c and the sacrificial gates is formed.

Masking layer 141 may then be planarized until the hard masks covering respectively sacrificial gates 110 and 210 are revealed.

After this, a first opening is formed in masking layer 141 (FIG. 9A), so as to reveal a central region of the first set of nanowire stacks 103a, 103b, 103c.

To this end a hard mask 243 may be defined above stacks 203a, 203b, 203c, which enables the sacrificial gate to be protected above these areas. This hard mask 243 may be, for example, made of polysilicon or silicon nitride, or silicon oxide, and may be, for example, between 3 and 10 nm thick.

A selective removal of second semiconductor material 107 relative to first semiconductor material 105 is then accomplished. This selective removal may be accomplished, for example, using Hcl blended with a carrier gas, or by $CF_4$-based chemical etching.

Suspended nanowires made of first semiconductor material 105, for example made of silicon, are thus obtained in first opening 145.

After the hard mask has been removed a second opening 245 is then formed in masking layer 141, so as to reveal a central region of the second set of stacks 203a, 203b, 203c. First opening 145 may, for its part, be filled at least partially using a mask to protect stacks 103a, 103b, 103c.

This protective mask may be produced, for example, using a material which can be etched selectively relative to that of masking layer 141, for example a material such as $Si_3N_4$ used to form the hard mask(s).

A selective removal of first semiconductor material 105 relative to second semiconductor material 107 in second opening 245 is then accomplished.

Suspended nanowires made of second semiconductor material 107 are obtained in opening 245 in this manner. The suspended nanowires made of second semiconductor material 107 retain the same critical dimension dc as after the stacks have been produced.

The protective mask in first opening 145 is then removed (FIG. 9B).

A gate may then be produced in openings 145, 245, so as to surround the nanowires of critical dimension dc.

According to another embodiment, after the selective removal of second semiconductor material 107 relative to first semiconductor material 105 in opening 145 has been accomplished, a gate stack is deposited in this opening 145.

A selective removal of first semiconductor material 105 relative to second semiconductor material 107 is then accomplished in a second opening 245 produced in masking layer 141, so as to reveal a central region of the second set of stacks 203a, 203b, 203c.

With such an embodiment, and compared to the previous embodiment, transistors of the PMOS type with a given gate stack suitable for the PMOS type, and nanowire transistors of the NMOS type with a different gate stack, suitable for the NMOS type, may be designed.

The invention claimed is:

1. A method for producing a microelectronic device including a transistor having a semiconductor structure formed of nanowires, wherein the method includes the following steps:
    a) producing on a support, a stack or multiple juxtaposed stacks of nanowires, where the stack or stacks has/have a constant transverse section, and is/are formed from nanowires alternating between nanowires of at least one first semiconductor material, and nanowires of at least one second semiconductor material, wherein the producing of the nanowire stack or stacks includes etching, through a hard mask, a stack of layers formed from alternating layers of the first semiconductor material, and of the second semiconductor material,
    b) forming a sacrificial gate on, and against the side walls of, at least one central area of at least one or more of said stacks of constant transverse section,
    c) forming insulating areas against side walls of said sacrificial gate, so as to cover areas of said side walls of said stacks, either side of said central area of said stacks,
    d) forming of semiconductor areas on end areas of at least one of said stacks by growth of at least one semiconductor material, wherein the nanowire stack or stacks is/are covered with said hard mask.

2. The method according to claim 1, wherein the producing in step a) of the nanowire stacks includes: anisotropic etching, through a hard mask, of a stack of alternating layers of the first semiconductor material and of the second semiconductor material, where said hard mask is formed from one or more areas of constant transverse section.

3. The method according to claim 1, further including, after step d), the following steps:
    forming on said support of a masking layer covering said stack or stacks and the sacrificial gate,
    forming an opening in the masking layer including the etching of the sacrificial gate so as to reveal said central area of said nanowire stack or stacks.

4. The method according to claim 3, wherein said opening has a critical dimension equal to the length of the sacrificial gate.

5. The method according to claim 3, wherein the sacrificial gate is formed in step b) by etching of a gate stack through another hard mask, where the forming of said opening in the masking layer includes the selective etching of said other hard mask before the sacrificial gate is etched.

6. The method according to claim 5, further including, after formation of the masking layer, and before the forming of said opening:
    removing of the masking layer until said other hard mask is reached.

7. The method according to claim 6, further including selectively removing the second semiconductor material relative to the first semiconductor material in said opening.

8. The method according to claim 7, further including, after the selective removal of the second semiconductor material: forming a gate in said opening.

9. The method according to claim 8, in which step b) includes: forming a sacrificial gate on one or more stacks from among said stacks, and forming another sacrificial gate on one or more other stacks from among said other stacks, and in which another opening is made in said masking layer covering said stacks, where the method further includes: removing said other sacrificial gate through said other opening, followed by the selective removal of the first semiconductor material relative to the second semiconductor material in said other opening.

10. The method according to claim 8, wherein, after step a) and before step b), the nanowires have a given critical dimension dc, where the gate is formed in said opening on and around nanowires of given critical dimension dc.

* * * * *